United States Patent
Meusel et al.

(10) Patent No.: US 11,588,067 B2
(45) Date of Patent: Feb. 21, 2023

(54) MONOLITHIC METAMORPHIC MULTI-JUNCTION SOLAR CELL

(71) Applicant: AZUR SPACE Solar Power GmbH, Heilbronn (DE)

(72) Inventors: Matthias Meusel, Heilbronn (DE); Alexander Berg, Heilbronn (DE); Philipp Schroth, Eichelberg (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/373,228

(22) Filed: Jul. 12, 2021

(65) Prior Publication Data
US 2022/0013677 A1   Jan. 13, 2022

(30) Foreign Application Priority Data
Jul. 10, 2020   (EP) .................................. 20000250

(51) Int. Cl.
*H01L 31/0725* (2012.01)
*H01L 31/054* (2014.01)
*H01L 31/074* (2012.01)

(52) U.S. Cl.
CPC ...... *H01L 31/0725* (2013.01); *H01L 31/0547* (2014.12); *H01L 31/074* (2013.01)

(58) Field of Classification Search
CPC ........... H01L 31/06875; H01L 31/0725; H01L 31/0735; H01L 31/1844; H01L 31/1892; H01L 31/0547; H01L 31/074
See application file for complete search history.

(56) References Cited

U.S. PATENT DOCUMENTS

| | | | |
|---|---|---|---|
| 6,660,928 B1 | 12/2003 | Patton et al. | |
| 2012/0080082 A1* | 4/2012 | Suh | H01L 31/03042 |
| | | | 257/E31.11 |
| 2012/0240987 A1* | 9/2012 | King | B82Y 20/00 |
| | | | 438/57 |
| 2013/0344645 A1* | 12/2013 | Ahmari | H01L 31/076 |
| | | | 438/94 |

(Continued)

FOREIGN PATENT DOCUMENTS

| | | |
|---|---|---|
| CN | 109860325 A | 6/2019 |
| DE | 102018203509 A1 | 7/2019 |

(Continued)

OTHER PUBLICATIONS

Hoehn et al : Development of Germanium-Based Wafer-Bonded Four-Junction Solar Cells, IEEE Journal of Photovoltaics, vol. 9 No. 6, Oct. 11, 2019, ISSN: 2156-3381.

(Continued)

*Primary Examiner* — Mayla Gonzalez Ramos
(74) *Attorney, Agent, or Firm* — Muncy, Geissler, Olds & Lowe, P.C.

(57) ABSTRACT

A monolithic multi-junction solar cell comprising a first III-V subcell and a second III-V subcell and a third III-V subcell and a fourth Ge subcell, wherein the subcells are stacked on top of one another in the specified order, and the first subcell forms the top subcell and a metamorphic buffer is formed between the third subcell and the fourth subcell and all subcells each have an n-doped emitter layer and a p-doped base layer and the emitter doping in the second subcell is lower than the base doping.

15 Claims, 2 Drawing Sheets

(56) References Cited

U.S. PATENT DOCUMENTS

| | | |
|---|---|---|
| 2017/0054048 A1 | 2/2017 | Derkacs |
| 2018/0226528 A1 | 8/2018 | Hart et al. |
| 2018/0240922 A1* | 8/2018 | Derkacs ............. H01L 31/1852 |
| 2019/0378948 A1 | 12/2019 | Dimroth et al. |
| 2020/0027999 A1* | 1/2020 | Derkacs ............ H01L 31/02008 |

FOREIGN PATENT DOCUMENTS

| | | |
|---|---|---|
| EP | 2960950 A1 | 12/2015 |
| EP | 3179521 A1 | 6/2017 |

OTHER PUBLICATIONS

Bauhuis et al : "Deep junction III-V solar cells with enhanced performance", Institute for Molecules and Materials, Radboud University, Mar. 11, 2016, DOI: 10.2002/pssa.201532903.

Van Leest et al : "Recent progress of solar cell development for CPV applications at Azur Space", Sep. 11, 2019, pp. 586-589, ISSN: 0094-243X.

Dimroth et al : Wafer bonded four-junction GaInP/GaAs//GaInAsP/GaInAs conenctrator solar cells with 44.7% efficiency, 2014-01013, DOI: 10.1002/pip.2475.

\* cited by examiner

MONOLITHIC METAMORPHIC MULTI-JUNCTION SOLAR CELL

This nonprovisional application claims priority under 35 U.S.C. § 119(a) to European Patent Application No. 20000250, which was filed in Europe on Jul. 10, 2020, and which is herein incorporated by reference.

BACKGROUND OF THE INVENTION

Field of the Invention

The present invention relates to a monolithic metamorphic multi-junction solar cell. Multi-junction solar cells of this kind are preferably used in space or in terrestrial concentrator photovoltaic systems (CPV). Here, at least three or more subcells with different band gaps are stacked on top of one another by means of tunnel diodes.

Description of the Background Art

The production of a four-junction solar cell with a subcell formed of GaInAsP is known from the publication "Wafer bonded four-junction GaInP/GaAs/GaInAsP/GaInAs concentrator solar cells with 44.7% efficiency" by Dimroth et al. in Progr. Photovolt: Res. Appl. 2014; 22: 277-282. In the cited publication, a GaInAsP solar cell with an energy band gap of approximately 1.12 eV is deposited lattice-matched starting from an InP substrate.

The upper subcells with a higher band gap are produced in a second deposition in inverted order on a GaAs substrate. The formation of the entire multi-junction solar cell takes place by means of a direct semiconductor bond of the two epitaxial semiconductor wafers, with subsequent removal of the GaAs substrate and further process steps. However, the production process is very complex and cost-intensive.

Other multi-junction solar cells with an InGaAsP subcell are known from EP 2 960 950 A1 and EP 3 179 521 A1, which corresponds to US 2017/0170354, which is incorporated herein by reference.

Furthermore, upright grown multi-junction cells with a metamorphic buffer, among others, are known from US 2018 0226 528 A1, US 2017 0054 048 A1, DE 10 2018 203 509 A1, and US 2020 0027 999 A1, and from van Leest et al.: "Recent progress of multi-junction solar cell development for CPV applications at AZUR Space," Proceedings of the 36$^{th}$ EU-PVSEC Conference, Sep. 11, 2019, pages 586-589, XP055672429.

A germanium-based bonded multi-junction solar cell is known from Höhn et al.: "Development of Germanium-Based Wafer-Bonded Four-Junction Solar Cells," IEEE Journal of Photovoltaics, IEEE, US, Vol. 9, No. 6, Sep. 11, 2019, pages 1625-1630, XP011755777, wherein the second subcell comprises a disordered low n-doped GaInP layer with a small layer thickness and a thin p-doped AlGaInP layer.

A single thin-film solar cell is known from Bauhuis et al.: "Deep junction III-V solar cells with enhanced performance," Phys. Status Solidi A, Vol. 213, No. 8, Mar. 7, 2016, pages 2216-2222, XP055743458, wherein the solar cell has a thin low-doped emitter layer and a thick higher-doped base layer.

The optimization of the radiation hardness, especially for very high radiation doses, is an important goal in the development of aerospace solar cells. In addition to increasing the initial or beginning-of-life (BOL) efficiency, the goal is also to increase the end-of-life (EOL) efficiency.

Furthermore, manufacturing costs are of crucial importance. The industrial standard at the present time is given by lattice-matched triple-junction solar cells and metamorphic GaInP/GaInAs/Ge triple-junction solar cells.

SUMMARY OF THE INVENTION

It is therefore an object of the present invention to provide a device that advances the state of the art.

In an exemplary embodiment of the invention, a monolithic multi-junction solar cell is provided comprising a first III-V subcell and a second III-V subcell and a third III-V subcell and a fourth Ge subcell.

The subcells can be stacked on top of one another in the specified order.

The first subcell forms the top subcell.

A metamorphic buffer is formed between the third subcell and the fourth subcell.

All subcells each have an n-doped emitter layer and a p-doped base layer, the emitter doping in the second subcell being lower than the base doping.

It is noted that the sunlight is always first irradiated through the top subcell with the largest band gap. Stated differently, the solar cell stack with the top subcell first absorbs the shortwave portion of the light. The band gap decreases from the first subcell to the fourth subcell, the band gap of the fourth subcell being approximately 0.67 eV.

In the present case, the photons thus first pass through the first subcell and then the second subcell and then the third subcell and finally the fourth subcell. A tunnel diode is preferably formed between two immediately successive subcells.

In an equivalent circuit diagram, the individual subcells of the multi-junction solar cell are to be understood as p/n diodes with tunnel diodes therebetween as connected in series. As a result, the subcell with the lowest current has a limiting effect; in other words, it is advantageous to match the current of the individual subcells to one another.

It should also be noted that the terms emitter and base are understood to mean either the n-doped or the p-doped layers in the respective subcell, in other words, the emitter layer and the base layer.

The top layer of a subcell, i.e., in the present case the emitter layer, is formed as an n-layer. As a result, the light in a subcell always first passes through the emitter layer and then through the base layer.

The emitter layer should be always above the base layer. In an example, in particular, no intrinsic layer with a thickness greater than 500 nm is formed between the emitter layer and the base layer.

The first subcell and/or the third subcell are preferably each a homo cell. The fourth subcell is also a homo subcell. Here, the term homo subcell is understood to mean a subcell in which the emitter layer has the same elements with the same stoichiometry as the base layer.

It should also be noted that in the present case the chemical abbreviations of elements are used synonymously with the full terms.

It is understood that the specified arsenic content can be based on the total content of group V atoms. Accordingly, the indicated indium content is based on the total content of group III atoms. In other words, in the compound $Ga_{1-X}In_XAs_YP_{1-Y}$ the indium content is the value X and the arsenic content is the value Y and this results in a Y value of 0.25 for an arsenic content of, e.g., 25%.

An advantage is that the described device surprisingly shows less degradation under proton irradiation. Because the emitter of the second subcell is lower doped than the base, the space charge region extends much more greatly into the emitter than into the base.

Stated differently, the reduction in efficiency during irradiation is less reduced; i.e., the EOL (end-of-life) parameter increases compared to the previous values.

In an example, no semiconductor bond is formed between the four subcells; in particular this covers the fact that no direct semiconductor bond is formed between two arbitrary subcells of the multi-junction solar cell.

Because the multi-junction solar cell is formed stack-like from a stack, it is understood that the stack of the multi-junction solar cell is not produced from two partial stacks which were deposited on different substrates and are subsequently joined together via a semiconductor bond. In particular, the solar cell stack does not have any amorphous intermediate layers, as can arise during bonding.

It should be noted further that the metamorphic buffer can be used to compensate for the lattice constant differences between the fourth cell and the third cell. In this case, the metamorphic buffer consists of at least three III-V layers.

A passivation layer formed of a compound with at least the elements GaInP or with at least the elements AlInP can be arranged above the layer of the second subcell and below the first subcell. Stated differently, the passivation layer is formed between the first subcell and the second subcell.

The lattice constant of the first subcell can differ from the lattice constant of the third subcell by less than 0.3% or by less than 0.2%. Stated differently, the third subcell and the second subcell and the first subcell are lattice-matched to one another.

A passivation layer can be formed of a compound with at least the elements GaInP or with at least the elements AlInP arranged below the layer of the second subcell and above the metamorphic buffer.

The second subcell and/or the further subcells may not have a multiple quantum well structure.

The emitter layer and the base layer of the second subcell each comprise or consist of InGaAsP.

The second subcell can be formed as a hetero cell. The emitter layer of the second subcell preferably comprises InGa(As)P or consists of InGa(As)P. The base layer comprises InGaAsP or consists of InGaAsP. The arsenic content of the emitter layer is preferably at least 5% less than the arsenic content of the base layer or, in an alternative embodiment, the emitter layer is formed arsenic-free.

The emitter layer preferably consists of InGaP and the base layer consists of InGaAsP or the emitter layer comprises InGaP and the base layer comprises InGaAsP, wherein in contrast to the base layer, the emitter layer in each case is free of arsenic.

Surprisingly, with regard to the degradation of the voltage under proton irradiation, it is advantageous to extend the space charge zone into the radiation-harder material, in this case the GaInP emitter layer. This is achieved by the doping of the emitter layer being lower than that of the base layer.

The indium content of the emitter layer in the second subcell can be between 53% and 75%.

The thickness of the emitter layer in the second subcell can be smaller than the thickness of the base layer. In an alternative embodiment, the thickness of the emitter layer is the same or substantially the same as the thickness of the base layer or greater than the base layer.

The emitter doping in the second subcell can be lower than the base doping at least by a factor of 3 or at least by a factor of 5 or at least by a factor of 8.

For example, in a region in the direction of the emitter layer, the base layer has a dopant concentration of less than $5 \cdot 10^{17}/cm^3$.

The base layer in the second subcell can have at least partially a dopant gradient. The dopant concentration preferably increases from a value of less than $5 \cdot 10^{17}/cm^3$ from a region near the emitter layer to a value greater than $1 \cdot 10^{18}/cm^3$ towards the third subcell.

The emitter doping level is preferably less than $2 \cdot 10^{17}/cm^3$ or less than $7 \cdot 10^{16}/cm^3$ but in each case greater than $1 \cdot 10^{16}/cm^3$.

The base layer of the second subcell has at least partially the dopants Zn or C or Mg. The emitter layer preferably has at least partially the dopants Si or Te or Se or Ge.

In one embodiment, the thickness of the base layer in the second subcell is greater than 100 nm, wherein the base layer has an arsenic content based on the elements of main group V between 22% and 33% and an indium content based on the elements of main group III between 52% and 65%. In one refinement, the lattice constant of the base layer is between 0.572 nm and 0.577 nm.

The first subcell can have a larger band gap than the second subcell. The second subcell can have a larger band gap than the third subcell. The third subcell has a larger band gap than the fourth subcell.

The first subcell can have a band gap in a range between 1.85 eV and 2.07 eV and the second subcell has a band gap in a range between 1.41 eV and 1.53 eV and the third subcell has a band gap in a range between 1.04 eV and 1.18 eV.

The first subcell can have a compound formed of at least the elements AlInP. The indium content based on the elements of main group III is between 64% and 75% and the Al content is between 18% and 32%.

The third subcell can have a compound formed of at least the elements InGaAs. The indium content based on the elements of main group III is above 17%.

A semiconductor mirror can be arranged between the third subcell and the fourth subcell. By incorporating a semiconductor mirror, the thickness of the base layer is reduced in a range between 50% and 90% compared to the thickness of the base layer without the semiconductor mirror.

The thickness of the base layer in the second subcell and the thickness of the base layer in the third subcell are each greater than 0.4 µm or greater than 0.8 µm.

The doping of the emitter layer in the third subcell can be greater than or less than or equal to the doping of the base layer. The doping of the emitter layer in the first subcell and in the fourth subcell is preferably greater than the doping of the base layer.

The thickness of the emitter layer in the first subcell and the fourth subcell can be smaller than the thickness of the base layer. The dopant concentration of the emitter layer in the first subcell and the second subcell is preferably above $5 \cdot 10^{17}/cm^3$.

A passivation layer formed of a compound with at least the elements GaInP or with at least the elements AlInAs or with at least the elements AlInP can be arranged above the layer of the second subcell and below the first subcell.

A passivation layer can be formed of a compound with at least the elements GaInP or with at least the elements AlInP is arranged below the layer of the second subcell and above the metamorphic buffer.

In an example, exactly four subcells or exactly five subcells are provided, wherein in the case of a multi-junction solar cell with five subcells, a fifth subcell is formed between the first subcell and the second subcell.

The fifth subcell can have a larger band gap than the second subcell and a smaller band gap than the first subcell. The fifth subcell is lattice-matched to the second subcell.

The fifth subcell can have an emitter layer doping that is greater than or less than or equal to the base layer doping.

In the fifth subcell, the thickness of the emitter layer can be greater than or equal to or less than the thickness of the base layer.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
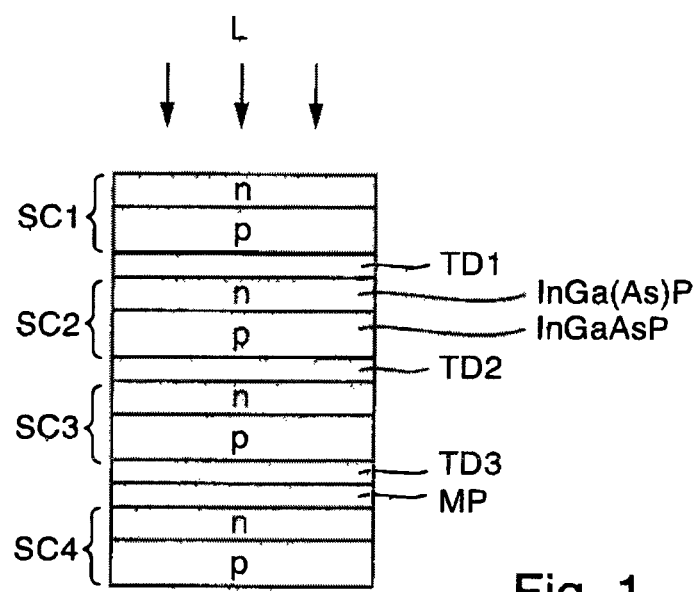
FIG. 1 shows a view of an example of a monolithic metamorphic multi-junction solar cell.

The illustration in FIG. 1 shows a first embodiment of a monolithic metamorphic multiple solar cell with a first top subcell SC1 on a second subcell SC2 below. Upon irradiation, the light L first strikes the top side of first subcell SC1

A top tunnel diode TD1 is formed between first subcell SC1 and second subcell SC2.

A third subcell SC3 is arranged below second subcell SC2. A second tunnel diode TD2 is formed between second subcell SC2 and third subcell SC3.

A fourth subcell SC4 is arranged below third subcell SC3. A third tunnel diode TD3 is formed between third subcell SC3 and fourth subcell SC4.

A metamorphic buffer MP is arranged between fourth subcell SC4 and third tunnel diode TD3.

Each of the subcells SC1, SC2, SC3, and SC4 has an n-doped emitter layer materially connected to a p-doped base layer.

Second subcell SC2 has an emitter formed of InGa(As)P and a base formed of InGaAsP. Here, the proportion of arsenic in the emitter is less than in the base or exactly zero. The doping in the emitter of second subcell SC2 is also less than the doping in the base.

Figure 2:
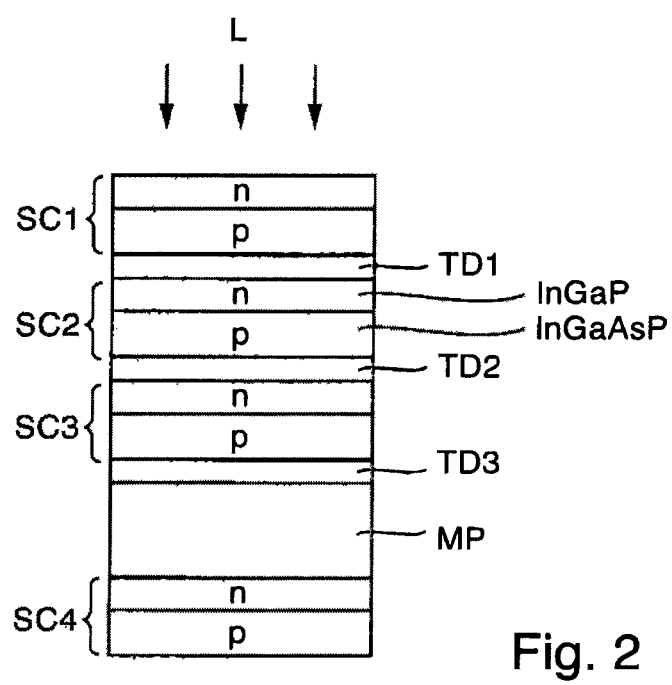
FIG. 2 shows a view of an example of a monolithic metamorphic multi-junction solar cell.

The illustration in FIG. 2 shows a second embodiment of a four-junction solar cell. Only the differences from the first embodiment are explained below.

Second subcell SC2 has an emitter formed of InGaP and a base formed of InGaAsP; i.e., the emitter has a ternary compound in contrast to the quaternary compound in the base. As a result, second subcell SC2 is designed as a so-called hetero cell.

Figure 3:
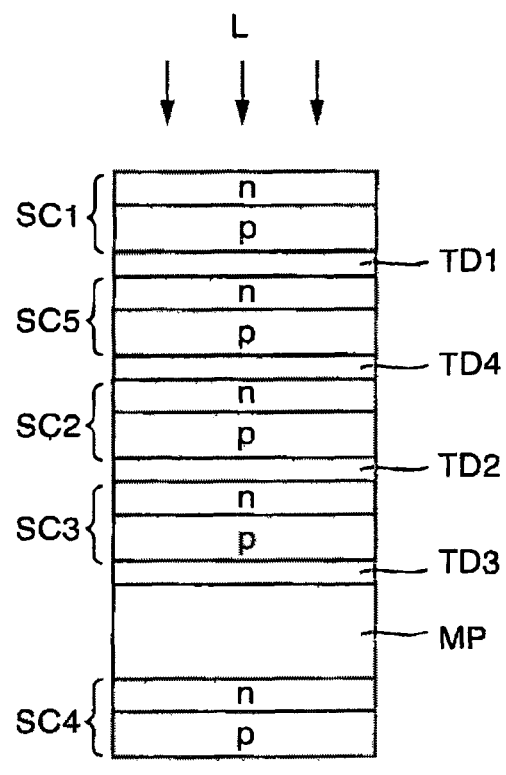
FIG. 3 shows a view of an example of a monolithic metamorphic multi-junction solar cell.

The illustration in FIG. 3 shows a third embodiment of a four-junction solar cell. Only the differences to the preceding embodiments will be described below.

A fifth subcell SC5 is arranged between first subcell SC1 and second subcell SC2. A fourth tunnel diode TD4 is arranged between fifth subcell SC5 and second subcell SC2. Fifth subcell SC5 is lattice-matched to the second subcell as well as to the third subcell.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A monolithic metamorphic multi-junction solar cell comprising:
a first III-V subcell;
a second III-V subcell;
a third III-V subcell;
a fourth Ge subcell, the first, second, third and fourth subcells being stacked on top of one another in the specified order, and the first subcell forms a top subcell, the first, second, third, and fourth subcells each have an n-doped emitter layer and a p-doped base layer;
a metamorphic buffer formed between the third subcell and the fourth subcell;
wherein no semiconductor bond is formed between the first, second, third and fourth subcells,
wherein a thickness of the emitter layer of the second subcell is less than a thickness of the base layer,
wherein, in the second subcell, an emitter doping of the emitter layer in a region at an interface between the emitter layer and the base layer is lower than a base doping of the base layer in a region at the interface between the emitter layer and the base layer, and
wherein the second subcell is formed as a hetero cell.

2. The monolithic metamorphic multi-junction solar cell according to claim 1, wherein the emitter doping in the second subcell is lower than the base doping at least by a factor of 3.

3. The monolithic metamorphic multi-junction solar cell according to claim 1, wherein the base layer in the second subcell comprises InGaAsP or consists of InGaAsP.

4. The monolithic metamorphic multi-junction solar cell according to claim 3, wherein the thickness of the base layer in the second subcell is greater than 100 nm, wherein the base layer has an arsenic content based on elements of main group V between 22% and 33% and an indium content based on elements of main group III between 52% and 65%, and wherein a lattice constant of the base layer is between 0.572 nm and 0.577 nm.

5. The monolithic metamorphic multi-junction solar cell according to claim 1, wherein the first subcell up to and including the third subcell is lattice-matched to one another.

6. The monolithic metamorphic multi-junction solar cell according to claim 1, wherein the first subcell has a band gap in a range between 1.85 eV and 2.07 eV and the second subcell has a band gap in a range between 1.41 eV and 1.53 eV and the third subcell has a band gap in a range between 1.04 eV and 1.18 eV.

7. The monolithic metamorphic multi-junction solar cell according to claim 1, wherein the first subcell has a compound formed of at least AlInP, in which the indium content based on elements of main group III is between 64% and 75% and the Al content between 18% and 32%.

8. The monolithic metamorphic multi-junction solar cell according to claim 1, wherein the third subcell has a compound formed of at least InGaAs, in which the indium content based on elements of main group III is greater than 17%.

9. The monolithic metamorphic multi-junction solar cell according to claim 1, wherein a semiconductor mirror is arranged between the third subcell and the fourth subcell.

10. The monolithic metamorphic multi-junction solar cell according to claim 1, wherein the thickness of the base layer in the second subcell and the thickness of the base layer in the third subcell are each greater than 0.4 µm or greater than 0.8 µm.

11. The monolithic metamorphic multi-junction solar cell according to claim 1, wherein the base layer in the second subcell has at least partially a dopant gradient and a dopant concentration thereof increases towards the third subcell to more than $1 \cdot 10^{18}/cm^3$.

12. The monolithic metamorphic multi-junction solar cell according to claim 1, wherein the base doping of the base layer in the second subcell in the region adjacent to the emitter layer in the second subcell has a dopant concentration of less than $5 \cdot 10^{17}/cm^3$.

13. The monolithic metamorphic multi-junction solar cell according to claim 1, wherein exactly four subcells or exactly five subcells are provided, or wherein a fifth subcell is formed between the first subcell and the second subcell.

14. The monolithic metamorphic multi-junction solar cell according to claim 1, wherein the emitter layer of the second subcell has a dopant concentration of less than $2 \cdot 10^{17}/cm^3$ and greater than $1 \cdot 10^{16}/cm^3$.

15. The monolithic metamorphic multi-junction solar cell according to claim 1, wherein the emitter layer in the second subcell comprises InGa(As)P or consists of InGa(As)P and the base layer comprises or consists of InGaAsP, wherein the arsenic content of the emitter layer is at least 5% less than the arsenic content of the base layer or the emitter layer is arsenic-free.

* * * * *